US011569309B2

(12) United States Patent
Wu

(10) Patent No.: US 11,569,309 B2
(45) Date of Patent: Jan. 31, 2023

(54) DISPLAY DEVICE

(71) Applicant: InnoLux Corporation, Miao-Li County (TW)

(72) Inventor: Yuan-Lin Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/376,173

(22) Filed: Jul. 15, 2021

(65) Prior Publication Data

US 2021/0343802 A1 Nov. 4, 2021

Related U.S. Application Data

(63) Continuation of application No. 17/000,373, filed on Aug. 24, 2020, now Pat. No. 11,094,755, which is a continuation of application No. 16/019,494, filed on Jun. 26, 2018, now abandoned.

(51) Int. Cl.
*G06F 3/041* (2006.01)
*H01L 27/32* (2006.01)
*H01L 51/00* (2006.01)
*G01D 5/241* (2006.01)
*G06F 3/044* (2006.01)

(52) U.S. Cl.
CPC ....... *H01L 27/3225* (2013.01); *G01D 5/2417* (2013.01); *G06F 3/041* (2013.01); *H01L 27/323* (2013.01); *H01L 27/3244* (2013.01); *H01L 51/0097* (2013.01); *G06F 3/044* (2013.01); *G06F 3/0416* (2013.01); *G06F 2203/04102* (2013.01); *G06F 2203/04111* (2013.01); *G06F 2203/04112* (2013.01); *H01L 2251/5338* (2013.01)

(58) Field of Classification Search
CPC ............... H01L 27/3225; H01L 27/323; H01L 27/3244; H01L 51/0097; H01L 2251/5338; H01L 27/3276; G01D 5/2417; G06F 3/041; G06F 3/0416; G06F 3/044; G06F 2203/04102; G06F 2203/04111; G06F 2203/04112; G06F 3/04166; G06F 3/0445; Y02E 10/549; G09F 9/301
See application file for complete search history.

(56) References Cited

U.S. PATENT DOCUMENTS

| | | | | |
|---|---|---|---|---|
| 10,372,163 | B2* | 8/2019 | Miyake | G06F 1/1652 |
| 10,411,205 | B2* | 9/2019 | Kwon | H01L 51/5237 |
| 10,768,766 | B2* | 9/2020 | Lee | G06F 3/045 |
| 2014/0152910 | A1* | 6/2014 | Kang | G06F 1/1643 |
| | | | | 349/12 |

(Continued)

*Primary Examiner* — Ibrahim A Khan
(74) *Attorney, Agent, or Firm* — Winston Hsu

(57) ABSTRACT

A display device includes a flexible substrate, a display layer disposed on the flexible substrate and including a plurality of light emitting units, a first conductive layer disposed on the display layer, including a plurality of first conductive lines, and a second conductive layer disposed on the first conductive layer, including a plurality of second conductive lines. A portion of the second conductive lines intersects the plurality of first conductive lines to form a plurality of capacitors, and another portion of the second conductive lines forms a plurality of touch units. At least one of the plurality of capacitors does not overlap the plurality of light emitting units in a top view of the display device.

6 Claims, 15 Drawing Sheets

(56) References Cited

U.S. PATENT DOCUMENTS

| | | | |
|---|---|---|---|
| 2015/0201487 A1* | 7/2015 | Kee | G02F 1/133305 |
| | | | 361/749 |
| 2015/0346776 A1* | 12/2015 | Miyake | G06F 3/0446 |
| | | | 345/174 |
| 2016/0188100 A1* | 6/2016 | Teranishi | G06F 3/0448 |
| | | | 345/174 |
| 2016/0195902 A1* | 7/2016 | Huh | G06F 1/188 |
| | | | 345/520 |
| 2016/0299610 A1* | 10/2016 | Yoon | H01L 51/5281 |
| 2016/0349878 A1* | 12/2016 | Kim | H05K 1/0298 |
| 2017/0192572 A1* | 7/2017 | Han | G06F 3/0412 |
| 2017/0199712 A1* | 7/2017 | Lee | G06F 1/163 |
| 2017/0338287 A1* | 11/2017 | Ito | H01L 51/0097 |
| 2018/0033398 A1* | 2/2018 | Okamoto | G09G 3/3233 |
| 2018/0069053 A1* | 3/2018 | Bok | H01L 51/5271 |
| 2018/0145256 A1* | 5/2018 | Yang | H01L 51/5209 |
| 2018/0238716 A1* | 8/2018 | Madden | G01L 1/146 |
| 2019/0018512 A1* | 1/2019 | Kim | B32B 27/288 |
| 2019/0094006 A1* | 3/2019 | Cao | G06F 3/03 |
| 2020/0150793 A1* | 5/2020 | Hsu | G06F 3/0445 |

\* cited by examiner

DISPLAY DEVICE

CROSS REFERENCE TO RELATED APPLICATIONS

This patent application is a continuation application and claims priority of U.S. patent application Ser. No. 17/000,373, filed on Aug. 24, 2020, which is a continuation application of U.S. patent application Ser. No. 16/019,494, filed on Jun. 26, 2018. All applications referenced herein are hereby fully incorporated by reference.

BACKGROUND OF THE DISCLOSURE

1. Field of the Disclosure

The present disclosure relates to a display device, and more particularly, to a flexible display device with bending sensor units.

2. Description of the Prior Art

In recent years, flexible electronic devices have become one of the focuses of the new generation electronic technology. The demand of the display device that can be integrated in the flexible electronic device is therefore increased. A flexible display device means the device can be curved, folded, stretched, flexed, bended, or the like. In order to improve the function and performance of the flexible display device, it is in need of detecting the bending status of the flexible display device so as to display corresponding images and providing corresponding control signals, which is still an important issue for the manufacturers.

SUMMARY OF THE DISCLOSURE

The present disclosure provides a display device that includes a flexible substrate, a display layer disposed on the flexible substrate and including a plurality of light emitting units, a first conductive layer disposed on the display layer, including a plurality of first conductive lines, and a second conductive layer disposed on the first conductive layer, including a plurality of second conductive lines. Wherein, a portion of the second conductive lines intersects the plurality of first conductive lines to form a plurality of capacitors, and another portion of the second conductive lines forms a plurality of touch units. At least one of the plurality of capacitors does not overlap the plurality of light emitting units in a top view of the display device.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

It should be noted that the technical features in different embodiments described in the following can be replaced, recombined, or mixed with one another to constitute another embodiment without departing from the spirit of the present disclosure.

Figure 1:
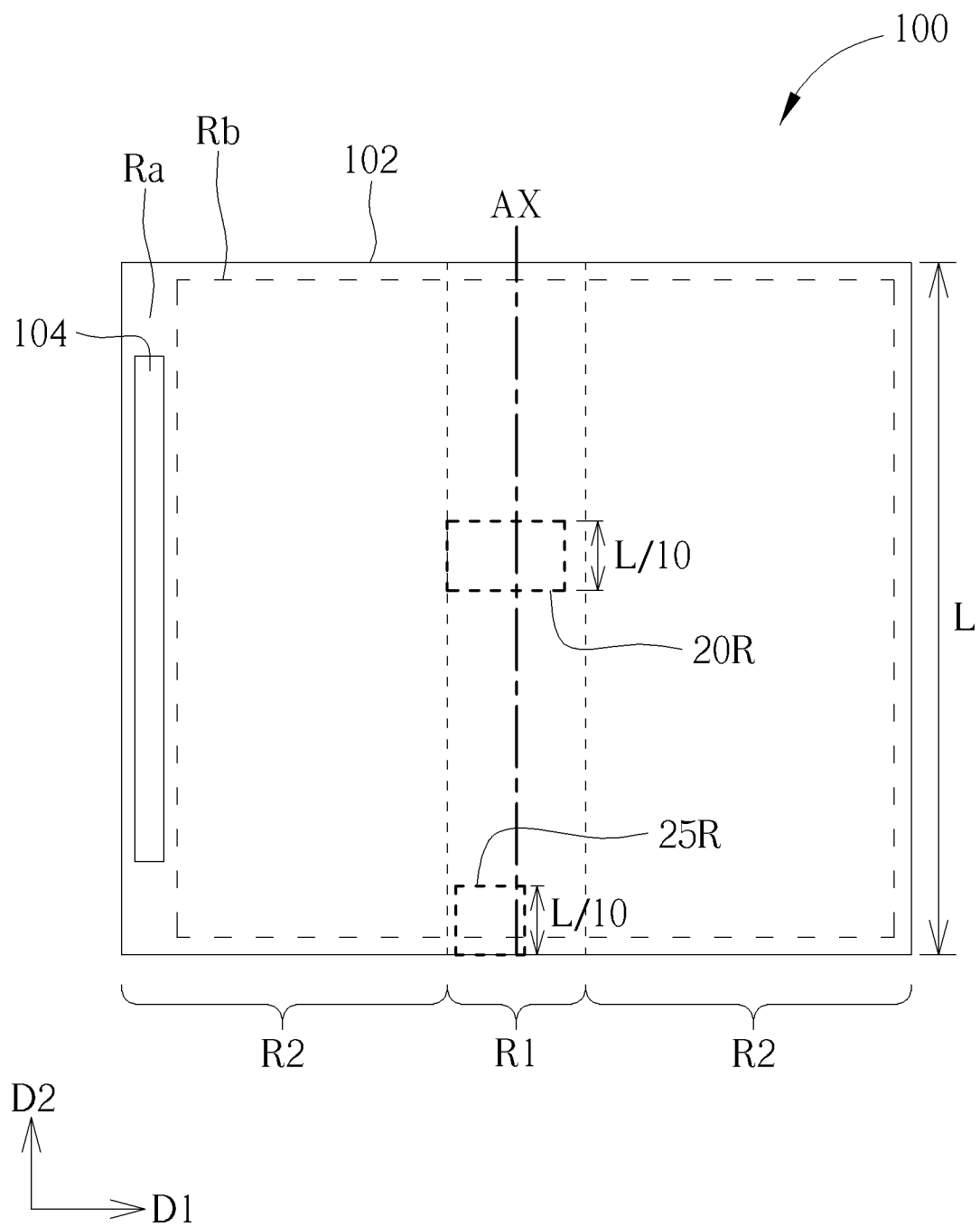
FIG. 1 is a schematic diagram of a top view of a display device according to a first embodiment of the present disclosure.
Figure 2:
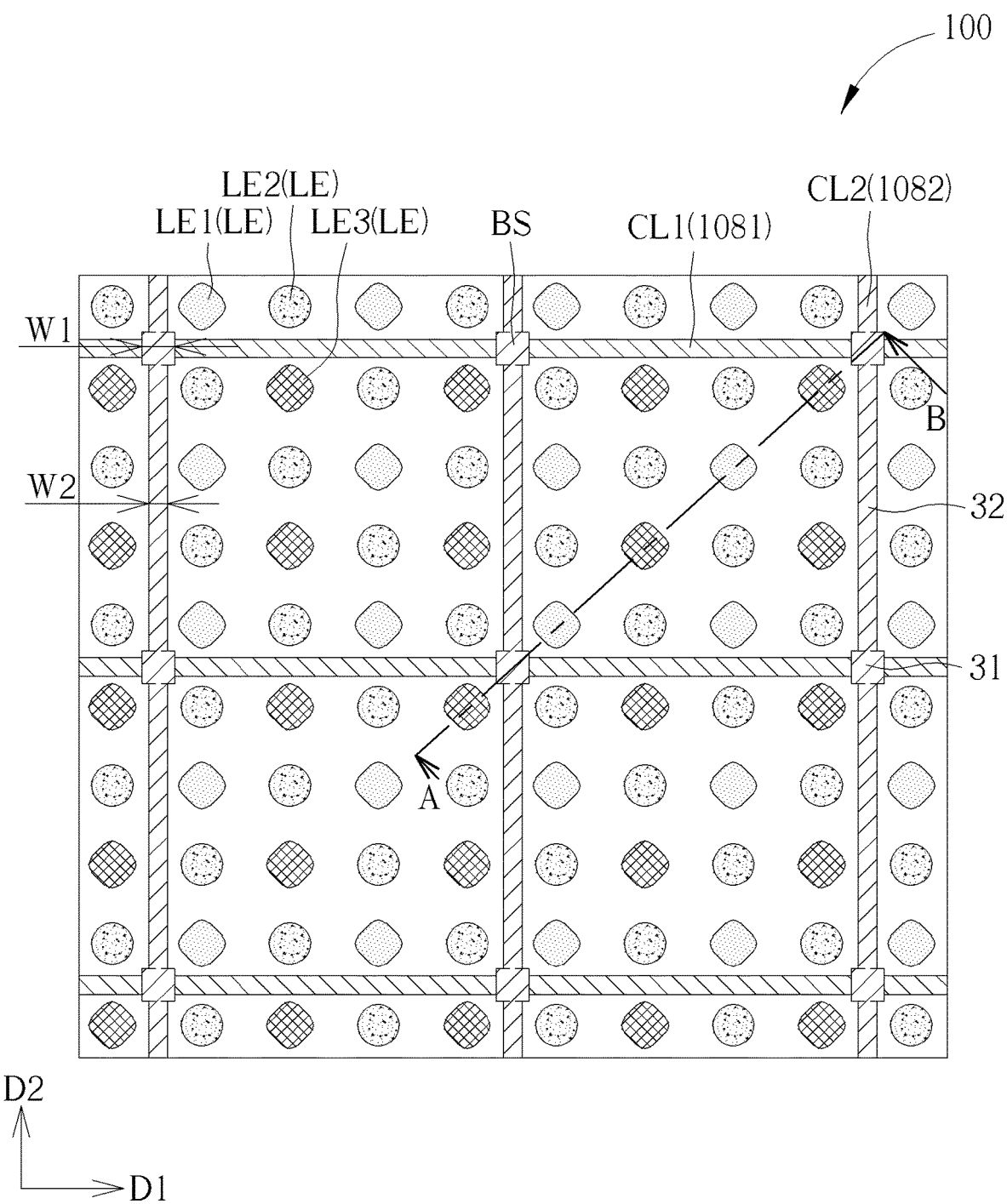
FIG. 2 is a partial-enlargement schematic diagram of a top view of the display region of the display device shown in FIG. 1.
Figure 3:
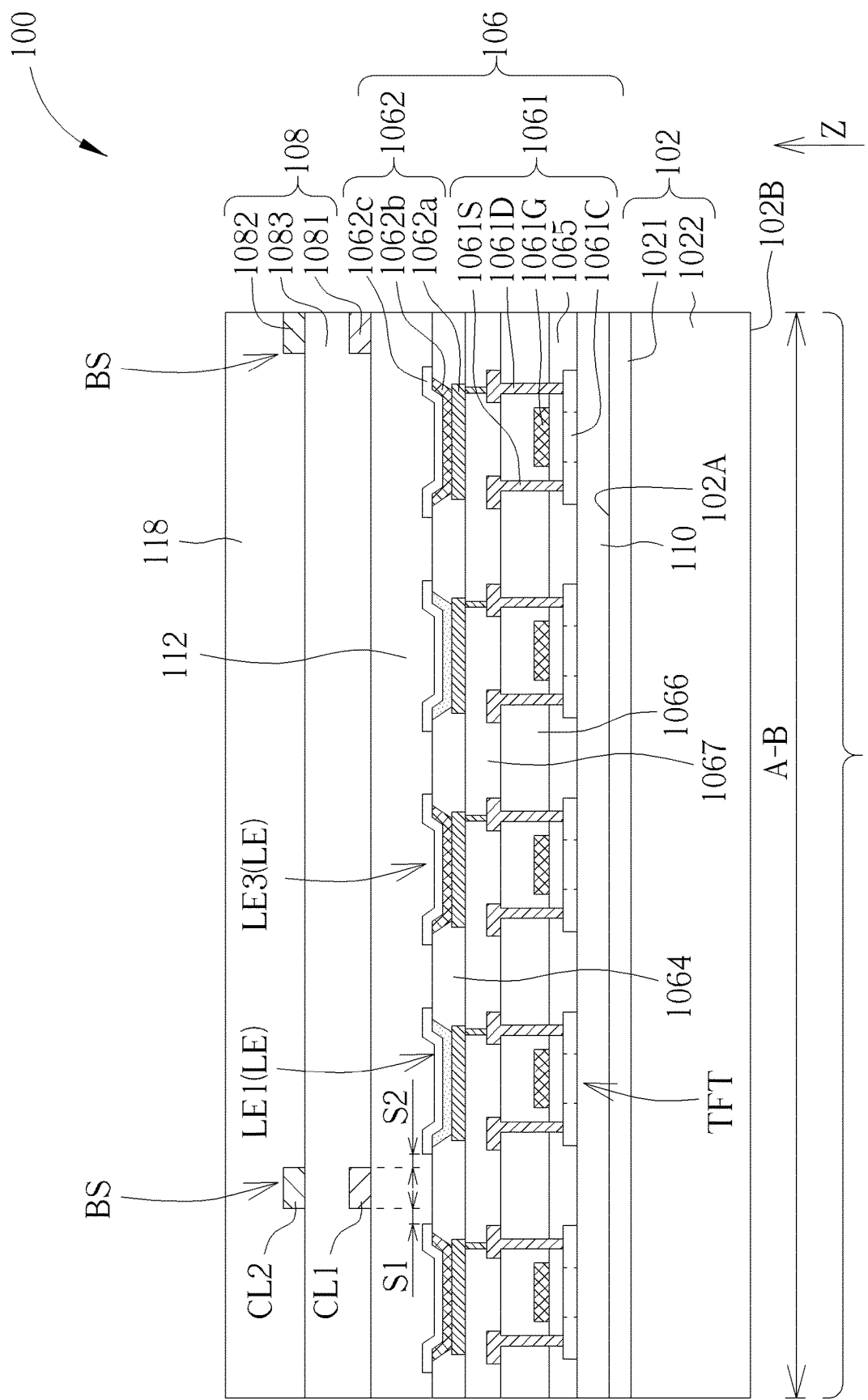
FIG. 3 is a schematic diagram illustrating a cross-sectional view along line A-B of the display device shown in FIG. 2.

Referring to FIG. 1 to FIG. 3, FIG. 1 is a schematic diagram of a top view of a display device according to a first embodiment of the present disclosure, FIG. 2 is a partial-enlargement schematic diagram of a top view of a display region of the display device shown in FIG. 1, and FIG. 3 is a schematic diagram illustrating a cross-sectional view along line A-B of the display device shown in FIG. 2. A display device 100 is provided in this embodiment. The display device 100 can be a flexible display device and can be capable of being repeatedly bended along at least a bending axis AX for example. The terms "bended" in the present disclosure means curved, bended, folded, rolled, stretched, flexed, or the like (generally referred to as "bended" or "flexible" hereinafter). In this embodiment, the display device 100 includes a substrate structure 102. For example, the substrate structure 102 may include a flexible substrate 1021. The substrate structure 102 has a first portion R1 which is a bendable region, and the first portion R1 of the substrate structure 102 can be repeatedly bended as mentioned above. The substrate structure 102 may further include a second portion R2 positioned adjacent to the first portion R1. The second portion R2 may be a main portion for displaying image and may be a non-bendable region, but not limited thereto. In this embodiment, the display device 100 includes two second portions R2 for instance, and the first portion R1 is disposed adjacent to and between the two second portions R2 in a first direction D1. The bending axis AX extends along a second direction D2. The second direction D2 is different from the first direction D1. In other words, the second direction D2 crosses the first direction D1. In this embodiment, the second direction D2 is perpendicular to the first direction D1 for example, but not limited thereto.

In addition, a peripheral region Ra and a display region Rb are defined on the substrate structure 102. The peripheral region Ra can be disposed at a side of the display region Rb. In this embodiment, the peripheral region Ra may surround the display region Rb, and one or more peripheral wires and elements may be disposed in the peripheral region Ra. For example, one or more control units 104 or integrated circuits (ICs) may be electrically connected to the wirings (not shown) on the substrate structure 102. Referring to FIG. 1, in some embodiments, the control unit 104 can be disposed in the peripheral region Ra and bent to a rear surface 102B of the substrate structure 102 (FIG. 1 shows the state of not bending to the rear surface 102B). In this way, the control unit 104 does not occupy the front surface 102A of the substrate structure 102. Accordingly, the area of the peripheral region Ra may be reduced. Or, alternatively, in some embodiments, the control unit 104 can be disposed on a flexible printed circuit board (not shown) and electrically connected to the wirings (not shown) on the substrate structure 102 by a chip on film (COF) technique. The flexible printed circuit board can also be bent to the rear surface 102B of the substrate structure 102. Thus, the control unit 104 does not occupy the front surface 102A of the substrate structure 102, and the area of the peripheral region Ra may be reduced.

Referring to FIG. 2 and FIG. 3, the display device 100 further includes a display layer 106 and a bending sensor layer 108. The display layer 106 is disposed on the front surface 102A of the substrate 102. The bending sensor layer 108 is disposed on the display layer 106 and includes a plurality of bending sensor units BS. The bending sensor units BS are disposed in the display region Rb. In this embodiment, since the first portion R1 is the bendable region of the display device 100, the bending sensor units BS are disposed within the first portion R1, but not limited thereto. In some embodiments, the bending sensor units BS may be disposed both in the first portion R1 and the second portions R2 or arranged in the whole display region Rb for instance. In some embodiments, a density of the bending sensor units BS in the first portion R1 is greater than a density of the bending sensor units BS in the second portions R2, but not limited thereto.

As shown in FIG. 2 and FIG. 3, the display layer 106 may include a plurality of light emitting units LE in the display region Rb of the display device 100. In this embodiment, the display layer 106 includes three kinds of light emitting units LE, such as a plurality of first light emitting units LE1, a plurality of second light emitting units LE2, and a plurality of third light emitting units LE3. For example, the first light emitting units LE1 can emit blue light, the second light emitting units LE2 can emit green light, and the third light emitting units LE3 can emit red light, but not limited thereto. The first light emitting units LE1, the second light emitting units LE2, and the third light emitting units LE3 may be arranged in an array alternately and repeatedly. The numbers of the first light emitting units LE1, the second light emitting units LE2, and the third light emitting units LE3 in the display region Rb may be identical or non-identical. For example, the number of the first light emitting units LE1 per unit area and the number of the third light emitting units LE3 per unit area may be less than the number of the second light emitting units LE2 per unit area in this embodiment, but not limited thereto. In addition, the areas or shapes of the first light emitting units LE1, the second light emitting units LE2, and the third light emitting units LE3 may be identical or non-identical. For example, the second light emitting units LE2 may have a round shape while the first light emitting units LE1 and the third light emitting units LE3 may have rectangular-like shapes in this embodiment, but not limited thereto.

According to the present disclosure, at least one of the plurality of bending sensor units BS are disposed between and spaced apart from at least two adjacent light emitting units LE of the plurality of light emitting units LE in a top view of the display device 100. In other words, at least one of the plurality of bending sensor units BS do not overlap at least two adjacent light emitting units LE in a top view of the display device 100. In this embodiment, all the bending sensor units BS are spaced apart from light emitting units LE, but not limited thereto.

Specifically, referring to FIG. 2 and FIG. 3, the bending sensor layer 108 may include a first conductive layer 1081 and a second conductive layer 1082 disposed on the first conductive layer 1081. The first conducive layer 1081 includes a plurality of first conductive lines CL1 extending along the first direction D1. The second conductive layer 1082 includes a plurality of second conductive lines CL2 extending along the second direction D2. In some embodiments, the first conductive lines CL1 and the second conductive lines CL2 can be in a linear shape (as shown in FIG. 2). In some embodiments, the first conductive lines CL1 and the second conductive lines CL2 can be in a non-linear shape, for example, a wavy shape or a zigzag shape, or can include a curved shape. The bending sensor layer 108 further includes an insulating layer 1083 disposed between the first conductive lines CL1 (the first conductive layer 1081) and the second conductive lines CL2 (the second conductive layer 1082) in a vertical direction Z perpendicular to the front surface 102A of the substrate structure 102. Thus, the plurality of first conductive lines CL1 and the plurality of second conductive lines CL2 intersect each other to form a plurality of bending sensor units BS. In other words, one bending sensor unit BS is defined by an overlapping portion of one first conductive line CL1 and one second conductive line CL2, together with the insulating layer 1083 corresponding to the overlapping portion. The bending sensor unit BS may be a capacitive-type sensor in this embodiment. Furthermore, a protection layer 118 may be selectively disposed on and cover the bending sensor layer 108. The protection layer 118 may include insulating material and provide protection to the bending sensor layer 108.

To compare the arrangement of the bending sensor units BS and the light emitting units LE, a density of the plurality of bending sensor units BS is less than a density of the plurality of light emitting units LE. The above-mentioned "density" means the total number of the referred elements per unit area (such as square inch), and the above-mentioned "density" can be calculated with reference to the whole display region Rb, or calculated with reference to an arbitrary region in the display region Rb. For example, the density of the bending sensor units BS (defined as $D_B$) can be calculated by dividing the total number of the bending sensor units BS by the total area of the display region Rb. Similarly, the density of the light emitting units LE (defined as $D_L$) can be calculated by dividing the total number of the light emitting units LE by the total area of the display region Rb. Or, alternatively, the density of the bending sensor units BS and the density of the light emitting units LE can also be calculated based on an arbitrary region in the display region Rb. Specifically, a given region in the display region Rb can be chosen, and this given region includes at least one bending sensor units BS and at least two light emitting units LE. In the given region, the density of the bending sensor units BS can be calculated by dividing the number of the bending sensor units BS by the area of the given region. Similarly, the density of the light emitting units LE can be calculated by dividing the number of the light emitting units LE by the area of the given region. For example, the given region can be a square shape, and can have an area of 1 inch×1 inch, or an area of 1 cm×1 cm.

In some embodiments, the given region can be an entire region of the first portion R1 (bendable region). In some embodiments, the given region can be chosen as a part of (not entire of) the first portion R1 (bendable region). For example, if the length of the first portion R1 along the second direction D2 is L, the given region can be chosen as a square or rectangular shape region with a length of one tenth of L (L/10) along the second direction D2. FIG. 1 shows two possible given region 20R and 25R, in which region 20R is in a rectangular shape and region 25R is in a square shape, but not limited thereto.

According to this embodiment, a ratio of the density of the bending sensor units BS to the density of the light emitting units in the top view of the display region Rb of the display device 100 is greater than or equal to 0.0001 and less than 0.5 (i.e., $0.0001 \leq D_B/D_L < 0.5$).

Referring to FIG. 2, one second conductive line CL2 includes a plurality of first parts 31 overlapping with the first conductive lines CL1, and a plurality of second parts 32 not overlapping with the first conductive line CL1. In some embodiments, the first parts 31 are the parts corresponding to the bending sensor units BS, and the second parts 32 are the parts not corresponding to the bending sensor units BS. In some embodiments, in one second conductive line CL2, the first parts 31 and the second parts 32 can have the same widths along the first direction D1.

In some embodiments, in one second conductive line CL2, the first parts 31 and the second parts 32 can have different widths along the first direction D1. For example, a first width W1 of the first part 31 (corresponding to the bending sensor unit BS) of the second conductive line CL2 can be greater than a second width W2 of the second part 32 (not corresponding to the bending sensor unit BS), along the first direction D1. In addition, the first conductive line CL1 corresponding to the bending sensor unit BS can have a width (not shown) greater than a width (not shown) not corresponding to the bending sensor unit BS. Thus, by means of the wider parts of the first conductive line CL1 and the second conductive line CL2, the bending sensor will have improved sensitivity.

The first conductive layer 1081 that forms the first conductive lines CL1 and the second conductive layer 1082 that forms the second conductive lines CL2 may include metal material (s) and/or metal oxide material (s), but not limited thereto. Examples of the metal material may include Mg, Ca, Al, Ag, W, Cu, Ni, Cr, or an alloy of one or more of the above-mentioned material. Examples of the metal oxide material may include indium tin oxide (ITO), indium zinc oxide (IZO), zinc oxide, or indium oxide. In some embodiments, the first conductive layer 1081 and the second conductive layer 1082 may include nanosilver wires. The first conductive layer 1081 and the second conductive layer 1082 independently can be a single layer or multiple layers. For example, the first conductive layer 1081 and the second conductive layer 1082 independently can be Mo/Al/Mo multiple layers or Ti/Cu/Ti multiple layers.

As shown in FIG. 3, the substrate structure 102 may include the flexible substrate 1021 and a supporting film 1022, and the flexible substrate 1021 can be adhered to the supporting film 1022 through a glue layer. The flexible substrate 1021 may include polymer material, thin glass, or any suitable material. Examples of material of the flexible substrate 1021 and the supporting film 1022 may include polyethylene terephthalate (PET), polyimide (PI), or polyethylene naphthalate (PEN), but not limited thereto.

The display layer 106 may include a plurality of driving elements 1061 and a plurality of display units 1062 arranged in an array, wherein each of the display units 1062 serves as one of the light emitting units LE mentioned above. Each driving element 1061 is electrically connected to a corresponding display unit 1062 for driving the corresponding display unit 1062. The driving elements 1061 in this embodiment are shown as driving TFTs, but not limited thereto. FIG. 3 shows that one driving element 1061 may overlap the corresponding display unit 1062 along a vertical direction perpendicular to the front surface 102A of the substrate structure 102, but not limited thereto.

The display units 1062 may be any type of display cells or elements, such as organic light-emitting diode (OLED), micro light-emitting diode (micro-LED), mini-LED, or quantum dot LED (QLED), but not limited thereto. As shown in FIG. 3, one display unit 1062 includes a first electrode 1062a, a second electrode 1062c, and a light emitting layer 1062b disposed between the first electrode 1062a and the second electrode 1062c. The first electrode 1062a may be an anode and the second electrode 1062c may be a cathode of the display unit 1062 in this embodiment for example, but not limited thereto. The light emitting region of each display unit 1062 can be defined by a dielectric layer 1064, which may serve as a pixel defining layer (PDL). The light emitting layer 1062b may include one or more layers of emissive material, and the emissive material can be inorganic or organic material. Different display units 1062 can emit lights with different colors, such as red, green and blue colors. For example, the light emitting layer 1062b in different display units 1062 can be made of different materials for emitting light of red, green, and blue. As shown in FIG. 3, blue light emitting units LE1 and red light emitting units LE3 are disposed alternately and repeatedly. In some embodiments, the light emitting layers 1062b in different display units 1062 can also be of the same material and emits the same light. The first electrode 1062a and the second electrode 1062c may include metal or transparent conductive material, but not limited thereto. Examples of the metal material of the electrodes may include Mg, Ca, Al, Ag, W, Cu, Ni, Cr, or an alloy of one or more of the above-mentioned material. Examples of the transparent conductive material may include indium tin oxide (ITO), indium zinc oxide (IZO), zinc oxide, or indium oxide.

As mentioned above, the driving element 1061 may be a thin film transistor (TFT) in this embodiment, which is a top-gate type TFT, but not limited thereto. Bottom-gate type TFT may be adopted in other embodiments, and the TFT structures may not be limited to only one type in a display device 100. One driving element 1061 may include a semiconductor layer 1061C, a dielectric layer 1065, a gate electrode 1061G, a dielectric layer 1066, a drain electrode 1061D, and a source electrode 1061S. The semiconductor layer 1061C may be formed with a semiconductor material, such as silicon or metal oxide, but not limited thereto. For example, the semiconductor layer 1061C may be an amorphous silicon layer, a polysilicon layer, or an indium gallium zinc oxide (IGZO) layer. Furthermore, the semiconductor layer 1061C includes a source contact, a drain contact, and a channel disposed between the source contact and the drain contact in one driving element 1061. The source electrode 1061S is electrically connected to the corresponding source contact through a via hole in the dielectric layer 1065 and the dielectric layer 1066. The drain electrode 1061D is electrically connected to the corresponding drain contact through another via hole in the dielectric layer 1065 and the dielectric layer 1066. The gate electrode 1061G is separated from the semiconductor layer 1061C by the dielectric layer 1065 which serves as the gate insulating layer of the driving element 1061. The gate electrode 1061G, the source electrode 1061S, and the drain electrode 1061D are formed of conductive materials (such as metal) , but not limited thereto. Suitable material for the gate electrode 1061G, the source electrode 1061S, and the drain electrode 1061D may refer to the material mentioned above for the first electrode 1062a and the second electrode 1062c. In the present disclosure, one driving element 1061 may be electrically connected to the corresponding display unit 1062 directly through the drain electrode 1061D for driving the display unit 1062. In detail, the drain electrode 1061D may be connected to the first electrode 1062a of the display unit 1062. In addition, a dielectric layer 1067 may be disposed between the first electrode 1062a of the display unit 1062 and the conductive layer forming the source electrode 1061S and the drain electrode 1061D.

Furthermore, in addition to the driving element 1061 mentioned above, the display layer 106 may further include one or more other electronic elements, such as, but not limited to, reset element(s), compensation element(s), operation control element(s), and capacitor(s). Although the driving element 1061 has a top-gate type of TFT structure, it is merely an example of the present disclosure and is not meant to limit the types or structures of the TFTs of the display layer 106 of the present disclosure. In addition, a buffer layer 110 may be disposed between the flexible substrate 1021 and the display layer 106. In this embodiment, the buffer layer 110 may include an oxide layer, a nitride layer or other suitable insulating layer, but not limited thereto. Furthermore, an encapsulation layer 112 may be disposed on the display layer 106. The encapsulation layer 112 may provide protection, encapsulation and/or planarization function for the display layer 106 and may include organic material, inorganic material, or a mixture thereof, but not limited thereto. For example, the encapsulation layer 112 can be multiple layers including an inorganic layer, an organic layer, and an inorganic layer.

As mentioned above, in some embodiments, the bending sensor units BS are space apart from and do not overlap the light emitting units LE. In some embodiments, one of the bending sensor units BS may be disposed between two adjacent light emitting units LE and right above the dielectric layer 1064. In this embodiment, for one bending sensor unit BS, the distance S1 between a side of the bending sensor unit BS and an adjacent light emitting units LE may be the same as the distance S2 between the other side of the bending sensor unit BS and another adjacent light emitting units LE, as shown in FIG. 3, but not limited thereto. In some embodiments, the distance S1 may be different from the distance S2.

Figure 4:
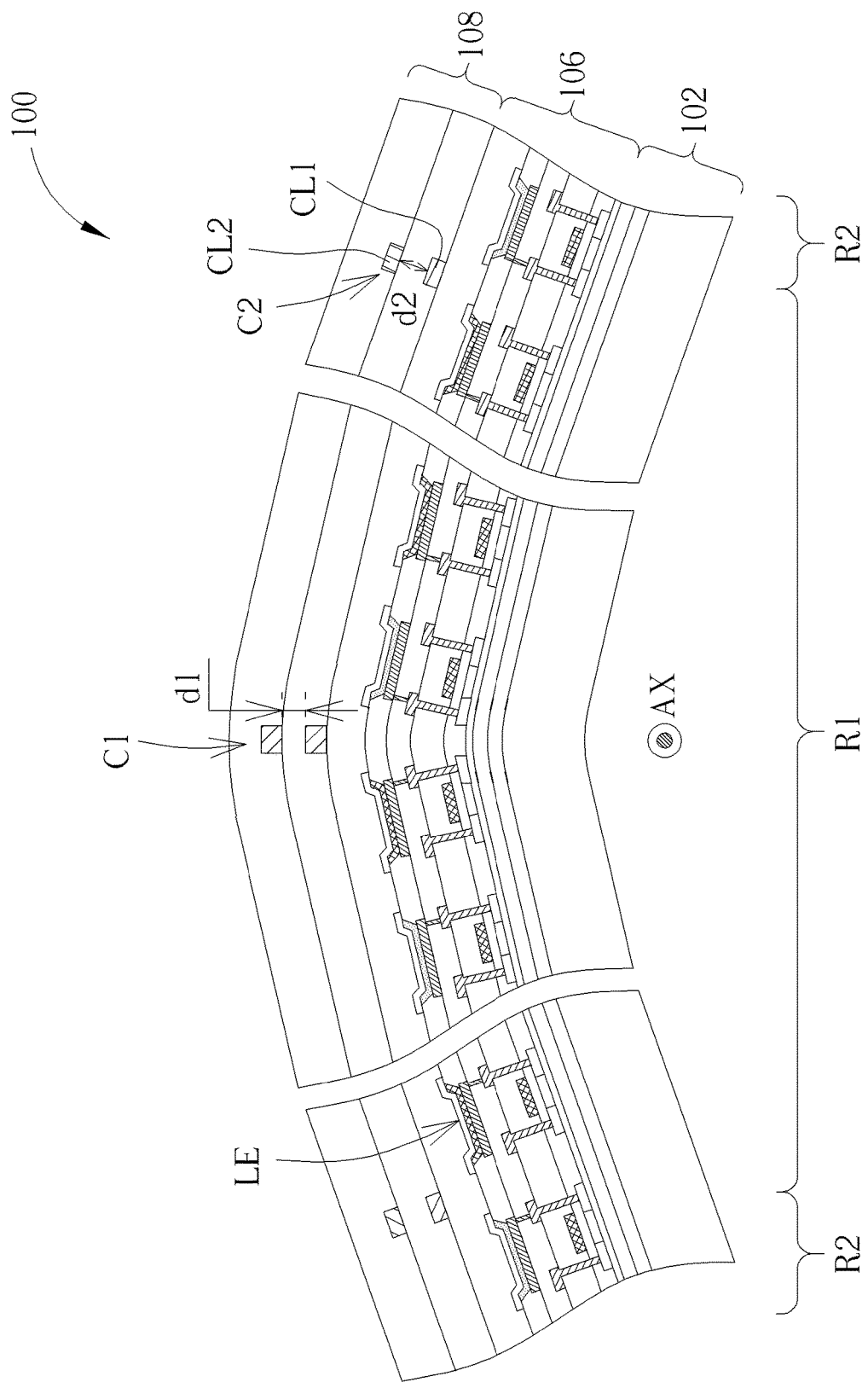
FIG. 4 is a partial-enlargement schematic diagram of a cross-sectional view illustrating a bending state of the display device shown in FIG. 3.

Referring to FIG. 4, FIG. 4 is a partial-enlargement schematic diagram of a cross-sectional view illustrating a bending state of the display device shown in FIG. 3. As shown in FIG. 4, When the display device 100 is in a bending state, the first portion R1 may be bended, curved, folded, stretched, flexed, or the like, while the second portion R2 may not be deformed or may remain a flat state. Accordingly, the layers in the first portion R1 may be pulled and stretched such that their thicknesses are thereby reduced. Accordingly, the distance between the first conductive line CL1 and the second conductive layer CL2 may be changed, such as becoming smaller than the original distance when the display device 100 is not bended or flexed. As shown in FIG. 4, the bending sensor unit BS near the central part of the first portion R1 or corresponding to the bending axis AX has a distance d1 between its first conductive line CL1 and second conductive layer CL2, which forms a first capacitor C1, and another bending sensor unit BS farther from the bending axis AX or near the second portion R2 has a distance d2 between its first conductive line CL1 and second conductive layer CL2, which forms a second capacitor C2. Since the central part of the first portion R1 has a larger curvature when the display device 100 is in a bending state, both the distance d1 and the distance d2 may be reduced in compare with the original distance. However, the distance d1 may further be smaller than the distance d2. Therefore, the capacitance variation of the first capacitor C1 formed of the bending sensor unit BS near the central part of the first portion R1 is greater than the capacitance variation of the second capacitor C2 formed of the bending sensor unit BS farther farm the central part of the first portion R1. Specifically, in the bending state, the capacitance of the first capacitor C1 is greater than the capacitance of the second capacitor C2 since the distance d1 is smaller than the distance d2 in the bending state. Accordingly, by collecting the capacitance values and variations of the bending sensor units BS at different parts of the first portion R1, the bending degree of the display device 100 and the bending state may be obtained.

Furthermore, in one aspect, the insulating layer 1083 may include organic material(s), such as hydrophobic organic material, piezoelectric material (such as polyvinylidene (PVDF)), and/or dielectric elastomers (such as rubber, acrylic elastomer, polyurethane elastomer, acrylonitrile butadiene rubber, vinylidene fluoride trifluoroethylene, or composite thereof), but not limited thereto. When the insulating layer 1083 is an organic material, the suitable insulating layer 1083 may have a Young's modulus in a range from 0.01 GPa to 10 GPa, and may have a thickness in a range from 0.8 µm to 10 µm, but not limited thereto. In another aspect, the insulating layer 1083 may include inorganic material, such as silicon oxide ($SiO_x$), silicon nitride ($SiN_x$), barium titanate ($BaTiO_3$), lead titanate ($PbTiO_3$), or lead zirconate titanate (PZT), but not limited thereto. When the insulating layer 1083 is an inorganic material, suitable insulating layer 1083 may have a dielectric constant in a range from 3 to 30, and may have a thickness in a range from 0.01 µm to 1 µm, but not limited thereto. By means of the above special design of the insulating layer 1083, a better flexing property and better sensitivity can be obtained, and probability of crack during folding can be reduced.

The display device of the present disclosure is not limited to the above mentioned embodiments. Further embodiments or variant embodiments of the present disclosure are described below. It should be noted that the technical features in different embodiments described can be replaced, recombined, or mixed with one another to constitute another embodiment without departing from the spirit of the present disclosure. For making it easier to compare the difference between the embodiments and variant embodiments, the following description will detail the dissimilarities among different variant embodiments or embodiments and the identical features will not be redundantly described.

Figure 5:
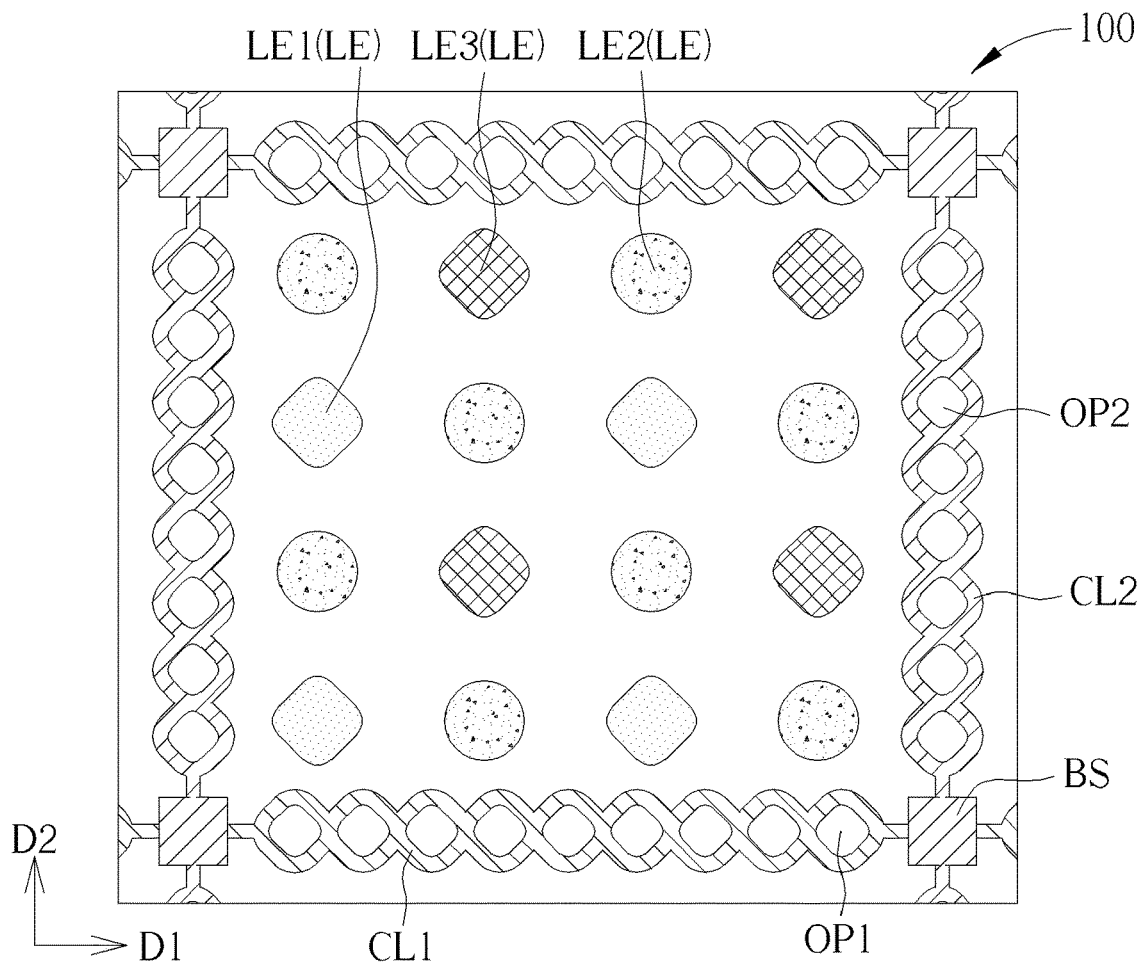
FIG. 5 is a partial-enlargement schematic diagram of a top view of the display region of a display device according to a first variant embodiment of the first embodiment of the present disclosure.
Figure 6:
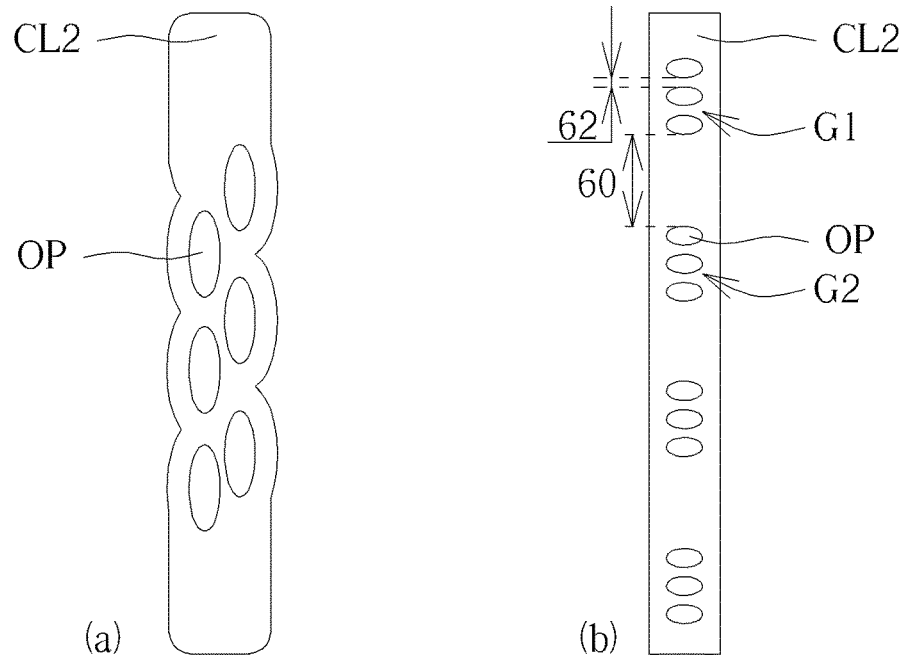
FIG. 6 is a partial-enlargement schematic diagram illustrating the conductive lines according to other variant embodiments of the first embodiment of the present disclosure.

Referring to FIG. 5 and FIG. 6, FIG. 5 is a partial-enlargement schematic diagram of a top view of a display device according to a first variant embodiment of the first embodiment of the present disclosure, and FIG. 6 is a partial-enlargement schematic diagram illustrating one of the conductive lines according to other variant embodiments of the first embodiment of the present disclosure. The first variant embodiment is different from the first embodiment in that the first conductive lines CL1 and the second conductive lines CL2 further include a plurality of openings. Specifically, at least one first conductive line CL1 can have a plurality of first openings OP1 and at least one second conductive line CL2 can have a plurality of second openings OP2. The first openings OP1 in the first conductive line CL1 can be adjacent to each other and arranged in the first direction D1, and the second openings OP2 in the second conductive line CL2 can be adjacent to each other and arranged in the second direction D2, but not limited to. The first opening OP1 and second opening OP2 can have curved shape or angular shape. The design of the first openings OP1 and the second openings OP2 may reduce the crack probability of the second conductive lines CL2 and the first conductive lines CL1 during bending. In some embodiments, the arrangement, numbers, shapes or patterns of the first openings OP1 and second openings OP2 may not be completely the same. In some other embodiments, the openings in the first conductive lines CL1 and the second conductive lines CL2 may have other kinds of shapes or have different sizes, numbers, or arrangement. As shown in FIG. 6, example (a) shows that the openings OP may have ellipse shapes and are arranged in a zigzag pattern, and example (b) shows that the openings OP are divided in several groups. For example, referring to example (b) in FIG. 6, one group G1 is spaced apart from another group G2 by a distance 60 greater than a distance 62 between two adjacent openings OP in the same group Gl. It should be noted that the arrangement and shapes of the openings OP, the first openings OP1, and the second openings OP2 shown in FIG. 5 and FIG. 6 are only examples and are not meant to limit the present disclosure. In some embodiments, the first openings OP1 and second opening OP2 can have areas less than the area of the light emitting units LE. In some embodiments, the first openings OP1 and second opening OP2 can have areas less than the area of the bending sensor units BS. In some embodiments, the first openings OP1 and second opening OP2 can have areas greater than or equal to 5 µm² (square micrometers) and less than or equal to 500 µm². If the areas of the first openings OP1 and second opening OP2 are too large (such as greater than 500 µm²), the resistance of the conductive lines may be too high. If the areas of the first openings OP1 and second opening OP2 are too small (such as less than 5 µm²), the performance of reducing stress may not be significant.

Figure 7:
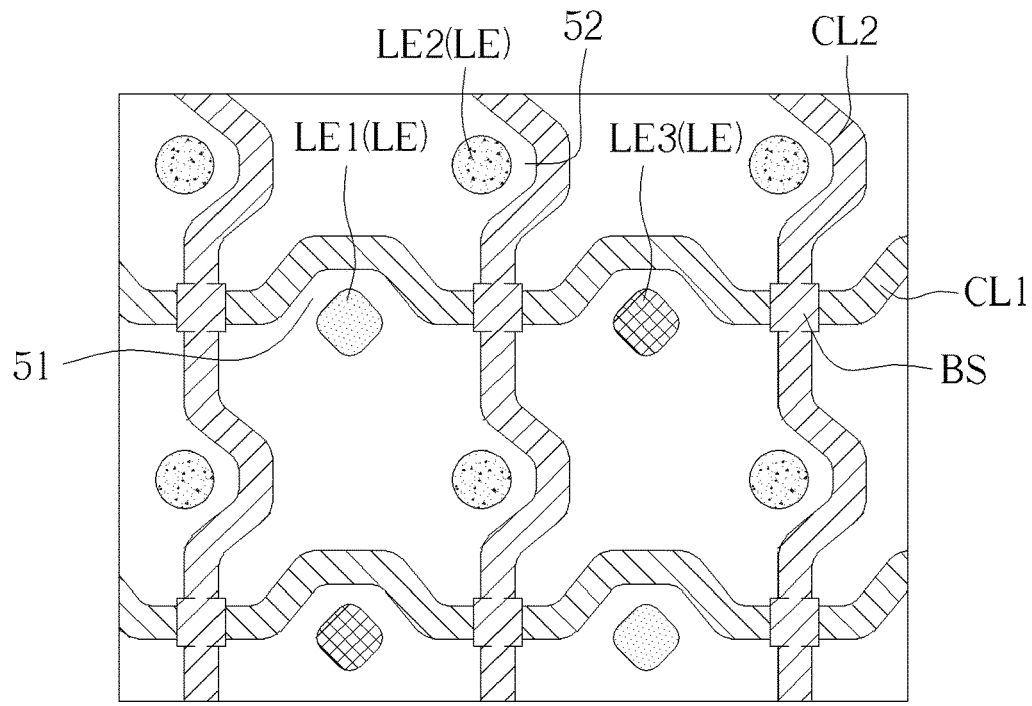
FIG. 7 is a partial-enlargement schematic diagram of a top view of the display region of a display device according to a second variant embodiment of the first embodiment.

Referring to FIG. 7, FIG. 7 is a partial-enlargement schematic diagram of a top view of a display device according to a second variant embodiment of the first embodiment of the present disclosure. The main difference between this variant embodiment and the first embodiment is that the first conductive lines CL1 and the second conductive lines CL2 can have recess portions. As shown in FIG. 7, in a top view of the display device, at least one first conductive line CL1 can have at least one first recess portion 51, and at least one second conductive line CL2 can have at least one second recess portion 52. For example, FIG. 7 shows that each first conductive line CL1 includes a plurality of first recess portions 51, and each second conductive line CL2 includes a plurality of second recess portions 52. At least one light emitting unit LE can be disposed in the first recess portion 51, and at least one light emitting unit LE can be disposed in the second recess portion 52. In FIG. 7, the first light emitting units LE1 are disposed in the first recess portions 51, the third light emitting units LE3 are disposed in other first recess portions 51, and the second light emitting units LE2 are disposed in the second recess portions 52.

Figure 8:
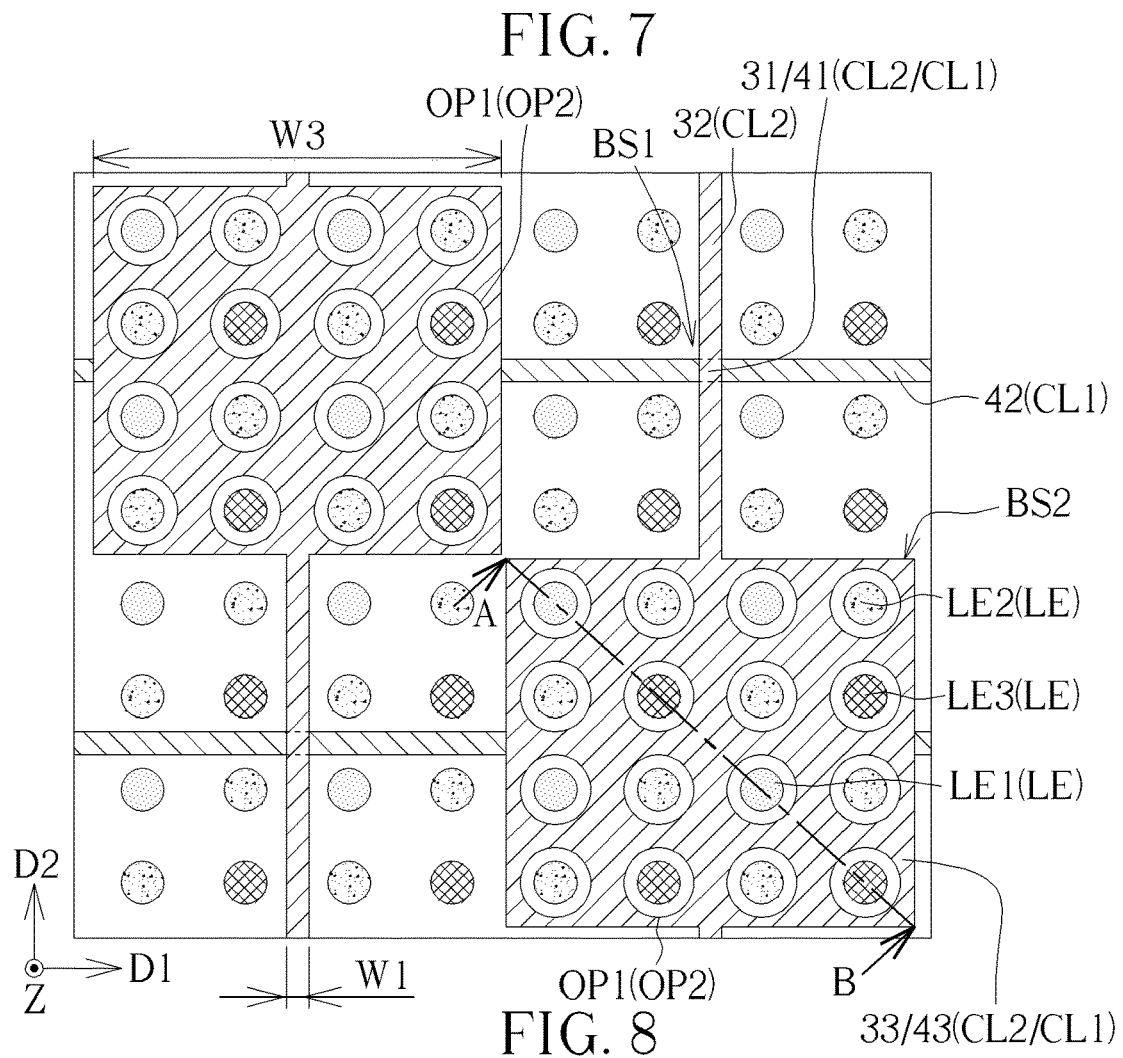
FIG. 8 is a partial-enlargement schematic diagram of a top view of the display region of a display device according to a second embodiment of the present disclosure.
Figure 9:
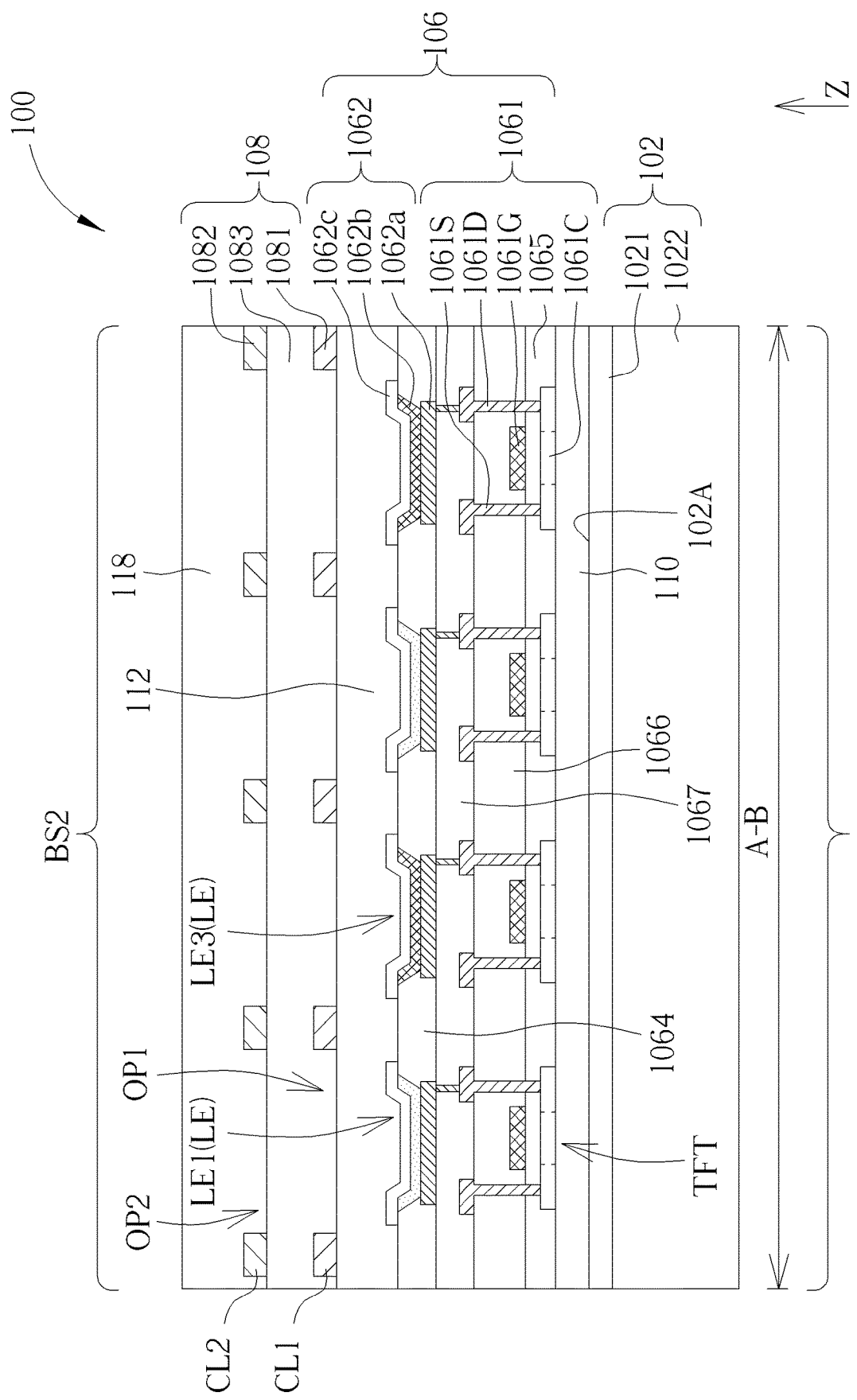
FIG. 9 is a schematic diagram illustrating a cross-section view along line A-B of the display device shown in FIG. 8.

Referring to FIG. 8 and FIG. 9, FIG. 8 is a partial-enlargement schematic diagram of a top view of a display device according to a second embodiment of the present disclosure, and FIG. 9 is a schematic diagram illustrating a cross-sectional view along line A-B of the display device shown in FIG. 8. Compared to the first embodiment as shown in FIG. 2, the display device 100 of FIG. 8 includes the first bending sensor units BS1 similar to the bending sensor units BS shown in FIG. 2, and further includes second bending sensor units BS2.

Similar to FIG. 2, referring to FIG. 8, one second conductive line CL2 includes a plurality of second parts 32 not overlapping with the first conductive lines CL1. In addition, one second conductive line CL2 includes a first part 31 and a third part 33, which overlap with the first conductive lines CL1. One second conductive line CL2 can include a plurality of first parts 31, a plurality of second parts 32, and a plurality of third parts 33. The first parts 31 correspond to the first bending sensor units BS1, and the third parts 33 correspond to the second bending sensor units BS2. The first part 31 and the second part 32 can have the same width or different widths along the first direction D1. In FIG. 8, the first parts 31 and the second parts 32 have the same width. The third parts 33 can have a third width W3 greater than the first width W1 of the first part 31 along the first direction D1, and the third part 33 can have a greater area than the area of the first part 31.

Similar to the design of the second conductive lines CL2, one first conductive line CL1 can include a plurality of first parts 41 corresponding to the first bending sensor units BS1, a plurality of second parts 42 not overlapping with the second conductive lines CL2, and a plurality of third parts 43 corresponding to the second bending sensor units BS2, and detailed descriptions are not repeated. Specifically, the first parts 31 of the second conductive lines CL2 and the first parts 41 of the first conductive lines CL1 overlap in the vertical direction Z to form a plurality of first bending sensor units BS1. The third parts 33 of the second conductive lines CL2 and the third parts 43 of the first conductive lines CL1 overlap in the vertical direction Z to form a plurality of second bending sensor units BS2.

Referring to FIG. 8 and FIG. 9, one of the third parts 33 of the second conductive line CL2 can include a plurality of second openings OP2, and one of the third parts 43 of the first conductive line CL1 can include a plurality of first openings OP1. In the top view, the first openings OP1 and the second openings OP2 overlap to form a plurality of overlapping openings. Some of the plurality of light emitting units LE are disposed in the positions corresponding to the plurality of overlapping openings OP1 (OP2). In this way, the second bending sensor units BS2 will not shield the light emitted from the corresponding light emitting units LE.

Accordingly, the area of the second bending sensor unit BS2 is greater than the area of the first bending sensor unit BS1. By means of the greater area of the second bending sensor units BS2, the sensitivity can be improved. In addition, one first bending sensor unit BS1 can have an area less than the area of one light emitting unit LE, while one second bending sensor unit BS2 can have an area greater than the area of one light emitting unit LE.

In addition, this embodiment is different from the previous embodiments that the light emitting units LE1, the light emitting units LE2, and the light emitting units LE3 shown in FIG. 8 have the same shapes, which are round shapes for example, but not limited thereto.

Figure 10:
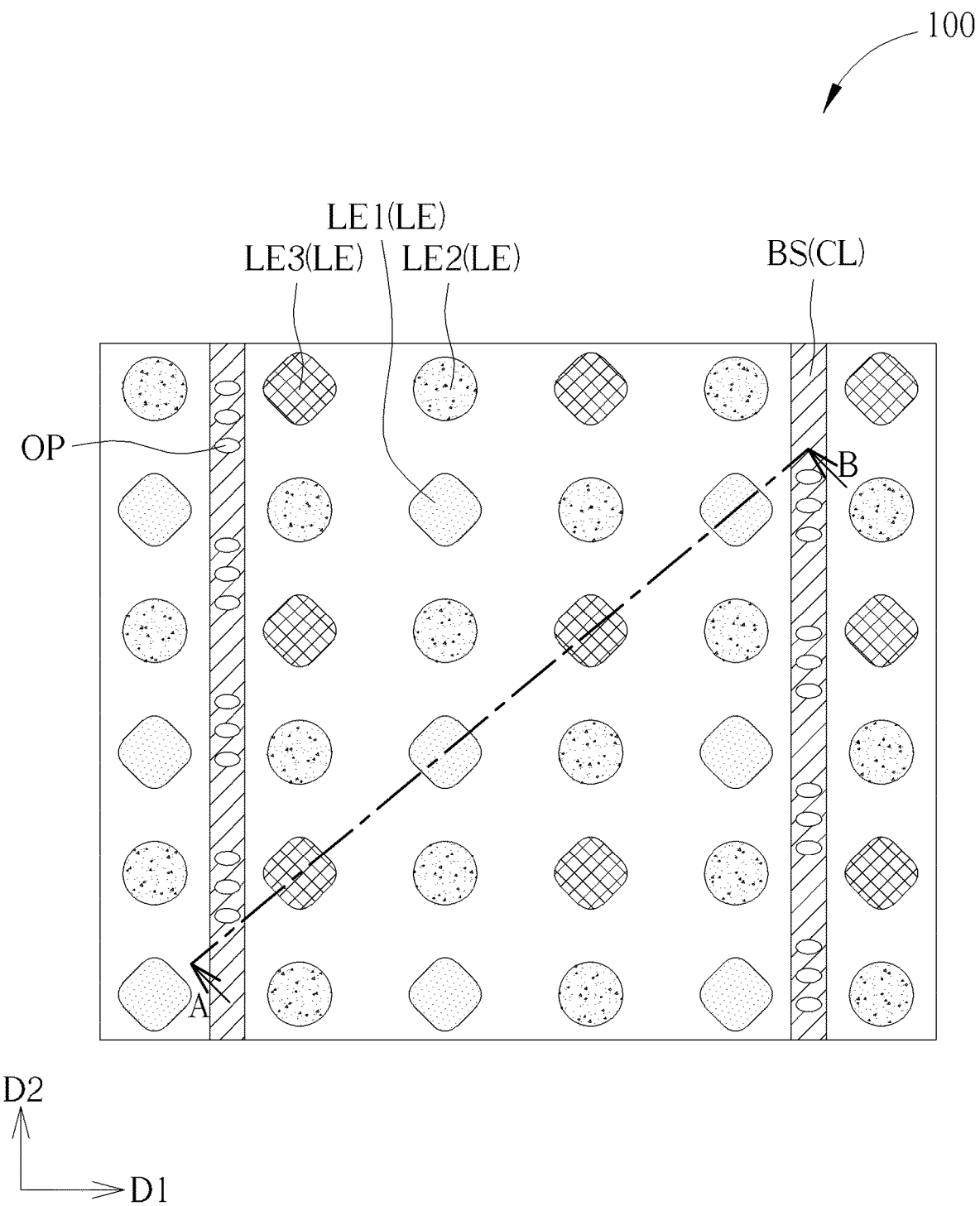
FIG. 10 is a partial-enlargement schematic diagram of a top view of the display region of a display device according to a third embodiment of the present disclosure.
Figure 11:
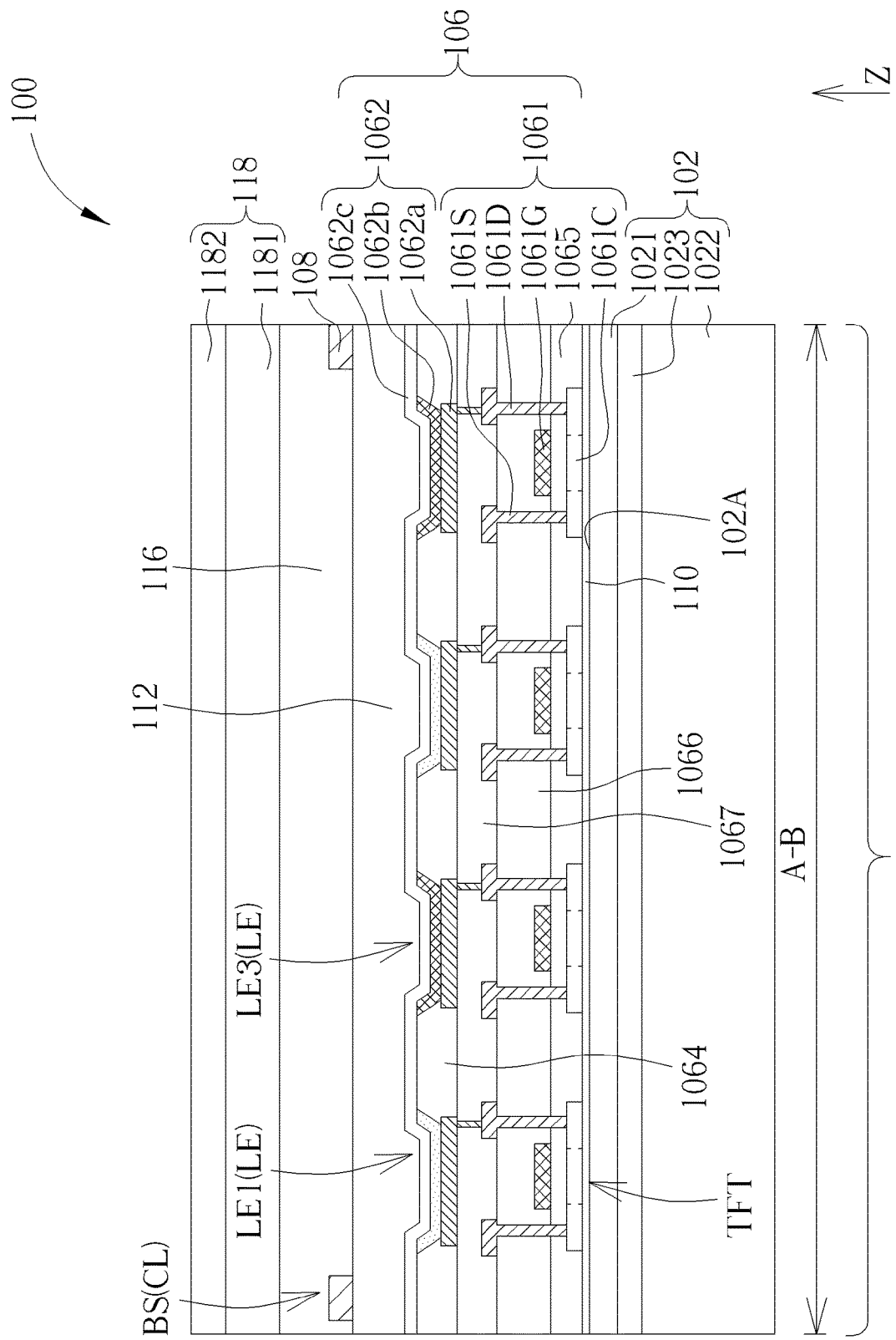
FIG. 11 is a schematic diagram illustrating a cross-sectional view along line A-B of the display device shown in FIG. 10.

Referring to FIG. 10 and FIG. 11, FIG. 10 is a partial-enlargement schematic diagram of a top view of the display region of a display device according to a third embodiment of the present disclosure, and FIG. 11 is a schematic diagram illustrating a cross-sectional view along line A-B of the display device shown in FIG. 10. As shown in FIG. 10 and FIG. 11, this embodiment is different from the first embodiment in that the bending sensor layer 108 shown in FIG. 11 only has one conductive layer. The conductive layer 108 includes a plurality of conductive lines CL extending along the second direction D2 and parallel to the bending axis, but not limited thereto.

Each of the conductive lines CL itself is defined as one bending sensor unit BS. The bending sensor units BS are resistive-type sensors, which can determine the bending state of the display device 100 by detecting the resistance variations of each conductive line CL. Specifically, when the display device 100 is folded or bended, each of the resistive-type bending sensor units BS in different positions of the display region Rb may be deformed in various degrees. Accordingly, the resistance of each bending sensor unit BS may be different, and therefore the degree of folding or curvature of the display device 100 may be obtained by calculating the difference of the resistance variations. By collecting input signals and output signals through the bending sensor units BS, the folding degree of the display device 100 may be obtained, but not limited thereto. The bending sensor units BS may further include a plurality of openings OP for reducing stress. In some embodiments, the openings OP can have areas less than the areas of the light emitting units LE. In some embodiments, the openings OP can have areas less than the areas of the bending sensor units BS. In some embodiments, the openings OP can have areas greater than or equal to 5 $\mu m^2$ and less than or equal to 500 $\mu m^2$. It is noted that the bending sensor units BS may be disposed only in the first portions R1 of the display region Rb. However, in some other embodiments, the bending sensor units BS may be disposed in the whole display region Rb. The method for calculating the density of the bending sensors units BS and the density of the light emitting units LE is the same as the above-mentioned method, and will not be repeated. According to some embodiments, a ratio of the density of the plurality of bending sensor units BS ($D_B$) to the density of the plurality of light emitting units LE ($D_L$) may be greater than or equal to 0.00001 and less than 0.1 (i.e., 0.00001 $D_B/D_L$<0.1). Moreover, the plurality of conductive lines CL which form the bending sensor units BS in this embodiment may have uniform width in the first direction D1, which is perpendicular to their extending direction (the second direction D2), but not limited thereto.

As shown in FIG. 11, this embodiment is further different from the first embodiment in that the second electrodes 1062c of different display units 1062 may be connected to each other and cover both the active area and the non-active area of the display layer 106. However, the bending sensor units BS still do not overlap two adjacent light emitting units LE (the light emitting areas of the display units 1062) in the top view of the display device 100. Besides, the substrate structure 102 shown in FIG. 11 may further include a supporting film glue 1023 disposed between the flexible substrate 1021 and the supporting film 1022, but not limited thereto. Moreover, a polarizer layer 116 may be disposed between the protection layer 118 and the bending sensor units BS. The protection layer 118 of the display device 100 in this embodiment may include an optical clear adhesive (OCA) layer 1181 and a cover layer 1182, wherein the OCA layer 1181 is disposed between the polarizer layer 116 and the cover layer 1182, but not limited thereto.

Figure 12:
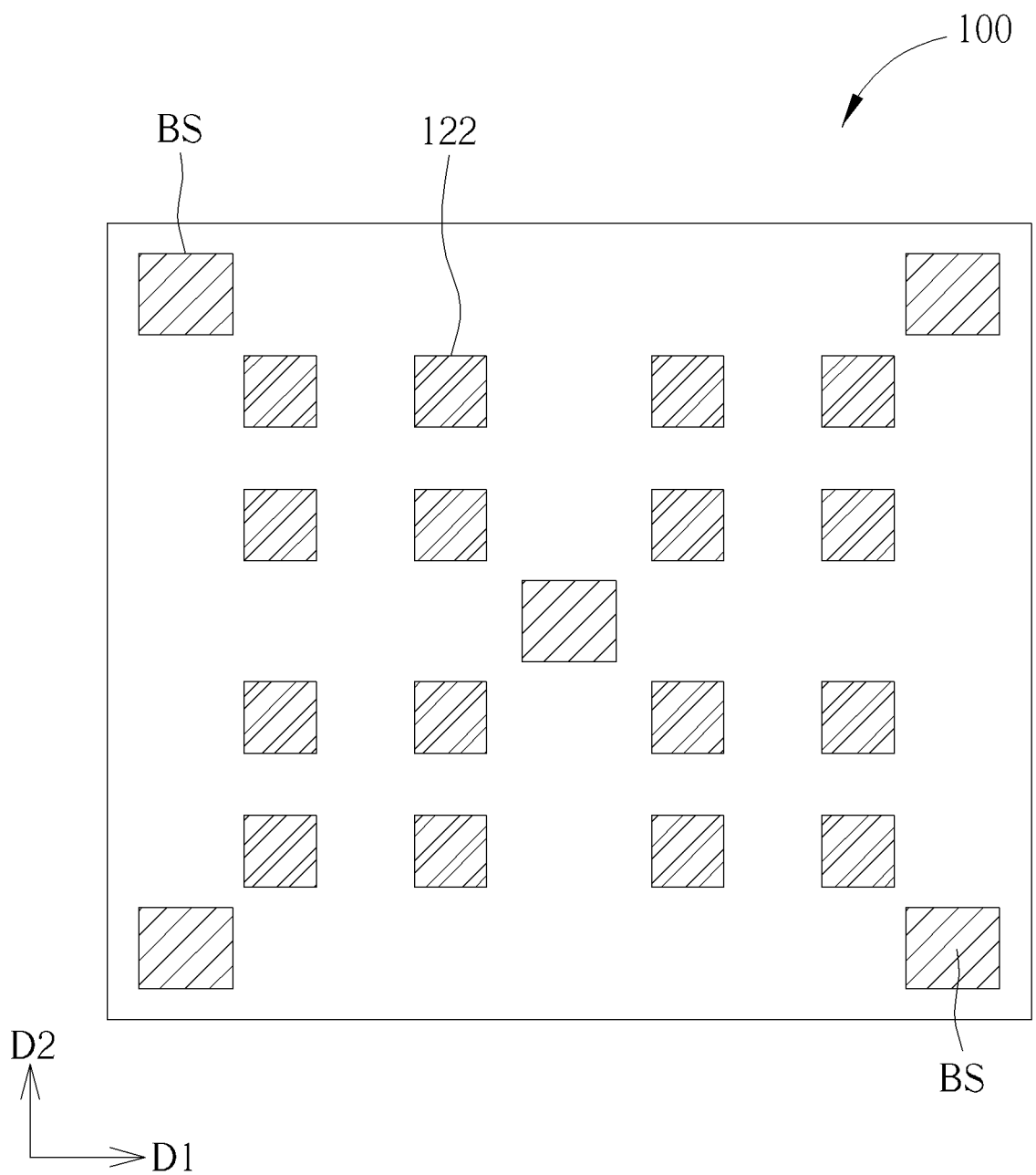
FIG. 12 is a partial-enlargement schematic diagram of a top view of the display region of a display device according to a fourth embodiment of the present disclosure.

Referring to FIG. 12, FIG. 12 is a partial-enlargement schematic diagram of a top view of the display region of a display device according to a fourth embodiment of the present disclosure. The display device 100 of this embodiment is a touch display device and further includes a plurality of touch units 122 disposed on the flexible substrate 1021. The touch units 122 can provide the functionality of detecting touch of the user for providing touch control signal. The touch units 122 of this embodiment may be formed with one conductive layer or may be formed with two conductive layers. In addition, the touch units 122 may be capacitive-type touch-sensing units or resistance-type touch-sensing units, but not limited thereto. In some embodiments, the touch units 122 may be formed with two conductive layers and an insulating layer. For example, two conductive layers may include touch electrodes and connecting bridges to form the touch units 122. The touch units 122 may be arranged in an array in the display region of the display device 100. According to this embodiment, the density of the plurality of bending sensor units BS ($D_B$) is less than the density of the plurality of touch units 122 ($D_T$). The density of the bending sensor units BS can be calculated as the previous description, and will not be repeated. Similarly, the density of the touch units 122 can be calculated based on the entire area of the display region, based on an arbitrary region in the display region, or based on an arbitrary region in the bendable region. For example, the density of the touch units 122 can be calculated by dividing the number of the touch units 122 by an area of a given region in the bendable region. With regard to the capacitive-type touch units, a ratio of the density of the bending sensor units BS to the density of the touch units 122 may be greater than or equal to 0.1 and less than 1 (i.e., $0.1 \leq D_B/D_T < 1$). The value of the ratio $D_B/D_T$ less than 1 may bring the advantage to reduce the interference between the touch signals and the bending sensor signals.

Figure 13:
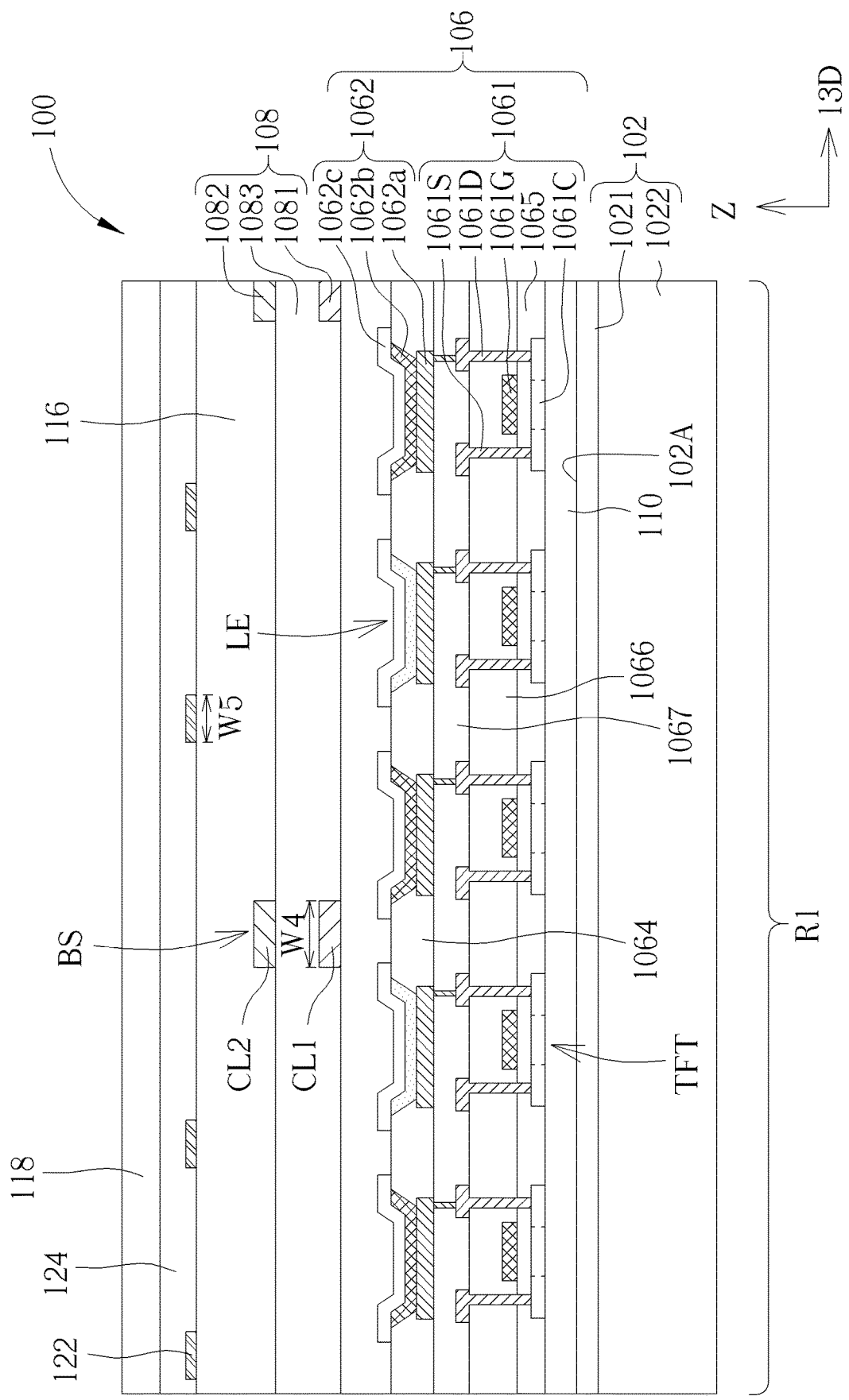
FIG. 13 is a cross-sectional schematic diagram of a cross-sectional view of a display device according to another embodiment.

FIG. 13 is a cross-sectional schematic diagram of a cross-sectional view of a display device according to another embodiment. As shown in FIG. 13, the bending sensors BS of this embodiment are capacitive-type sensors and are formed with the first conductive lines CL1 and the second conductive lines CL2. The touch units 122 are disposed on the bending sensor units BS and do not overlap or cover the bending sensor units BS in the direction Z perpendicular to the front surface 102A of the substrate structure 102. In addition, a time-sharing driver may be provided to control the bending sensor units BS and the touch units 122 such that the detecting time of the bending sensor units BS would not overlap the detecting time of the touch units 122, so as to further reduce signal coupling or signal interference, but not limited thereto. The touch units 122 can be in a metal mesh type. Furthermore, in the cross-sectional view, the width of the bending sensor units BS can be greater than the width of the plurality of touch units 122 according to the present disclosure along the same direction. For example, the width of one of the plurality of bending sensor units BS along a direction 13D is defined as a width W4, and a width of one of the plurality of touch units 122 along the direction 13D is defined as width W5, wherein the width W4 is greater than the width W5. The conductive layer for forming the touch units 122 may include transparent conductive material or may be a metal mesh layer, but not limited thereto. When the touch units 122 are formed with metal mesh layer, the touch units 122 may not overlap the light emitting units LE along the direction perpendicular to the front surface 102A of the substrate structure 102. When the touch units 122 are formed with transparent conductive layer, the touch units 122 may overlap the light emitting units LE. In some embodiments, the width W5 can be the width of one metal mesh. In addition, an anti-reflection layer 124 may cover the touch units 122 to mitigate the reflection issue caused by the touch units 122 or to improve the appearance of the display device 100. In some embodiments, a minimum width of one bending sensor (such as capacitive-type) can be greater than a minimum width of one touch unit.

Figure 14:
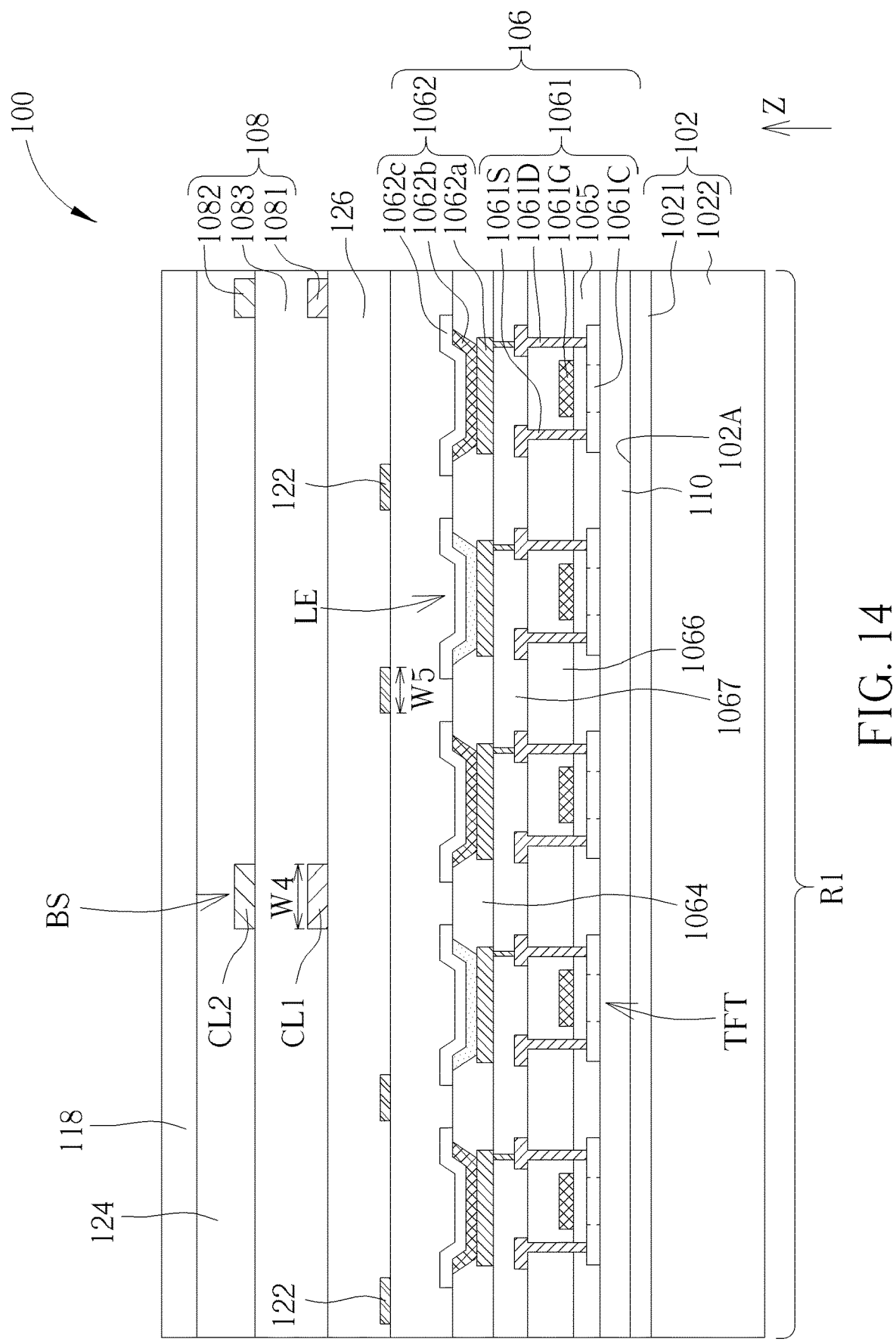
FIG. 14 is a partial-enlargement schematic diagram illustrating a cross-sectional view of a display device according to a fifth embodiment of the present disclosure.

Referring to FIG. 14, FIG. 14 is a partial-enlargement schematic diagram illustrating a cross-sectional view of a display device according to a fifth embodiment of the present disclosure. This embodiment is different from the embodiment shown in FIG. 13 in that the positions of the touch units 122 and the bending sensor units BS are exchanged in the direction perpendicular to the front surface 102A of the substrate structure 102 in the structure of the display device 100 shown in FIG. 14. In other words, the touch units 122 are disposed between the display layer 106 and the bending sensor layer 108. In this embodiment, the anti-reflection layer 124 can be in contact with the second conductive lines CL2 and covers the second conductive lines CL2, and an insulating layer 126 may be disposed between the touch units 122 and the bending sensor units BS.

Figure 15:
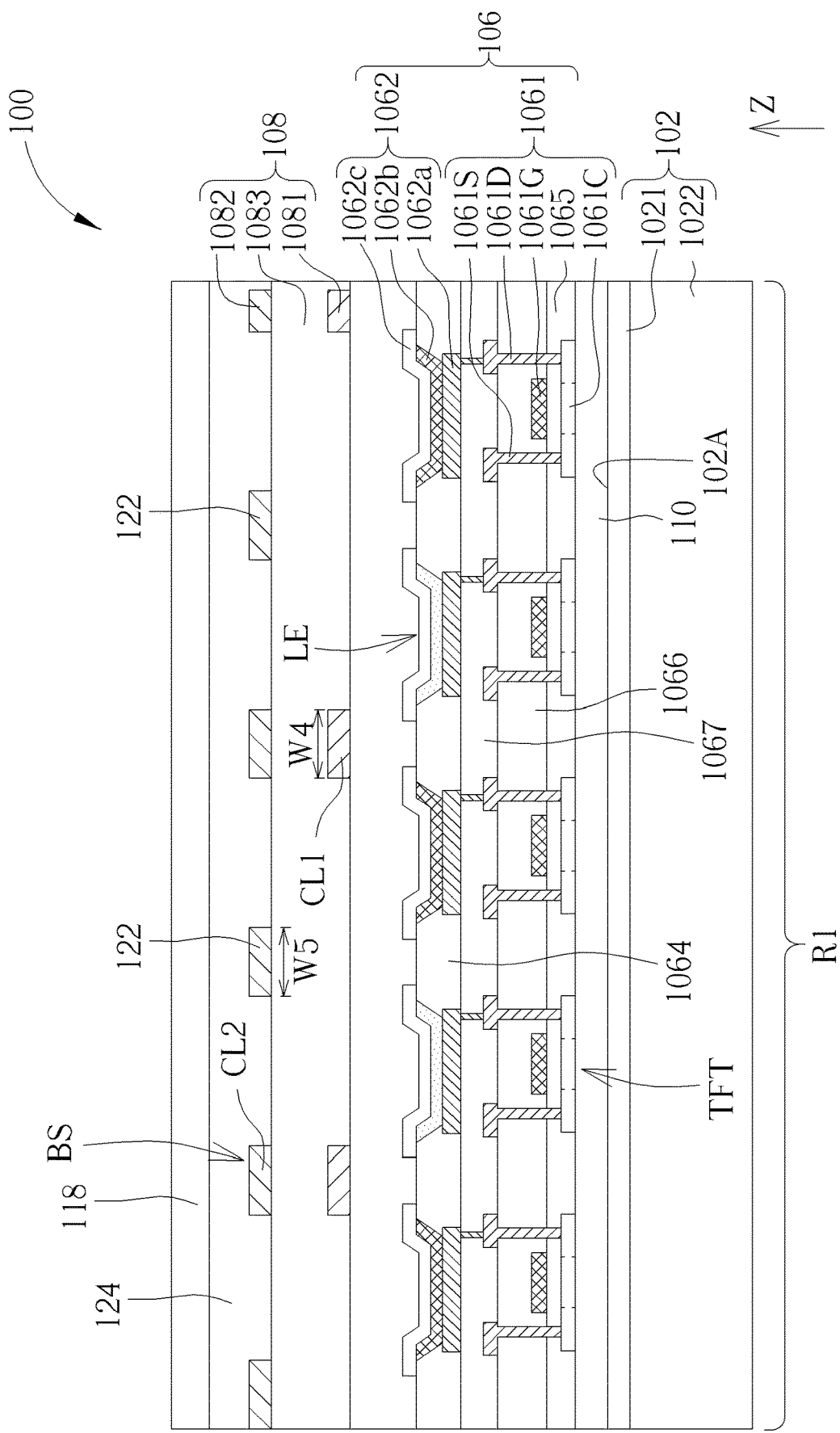
FIG. 15 is a partial-enlargement schematic diagram illustrating a cross-sectional view of a display device according to a sixth embodiment of the present disclosure.

Referring to FIG. 15, FIG. 15 is a partial-enlargement schematic diagram illustrating a cross-sectional view of a display device according to a sixth embodiment of the present disclosure. This embodiment is different from the fourth embodiment in that the touch units 122 can be of the same layer as the second conductive lines CL2. That is, the second conductive layer 1082 includes the touch units 122 and the second conductive lines CL2. In other words, the touch units 122 and the second conductive lines CL2 are formed with the same conductive layer. Specifically, a portion of the second conductive layer 1082 forms the second conductive lines CL2 intersecting the first conductive lines CL1 to form the bending sensor units BS, and another portion of the second conductive layer 1082 may form the touch units 122 that do not overlap the first conductive lines CL1. A time-sharing driver may be used for controlling the timing to transfer or receive touch signals and bending sensor signals alternately in this embodiment.

Figure 16:
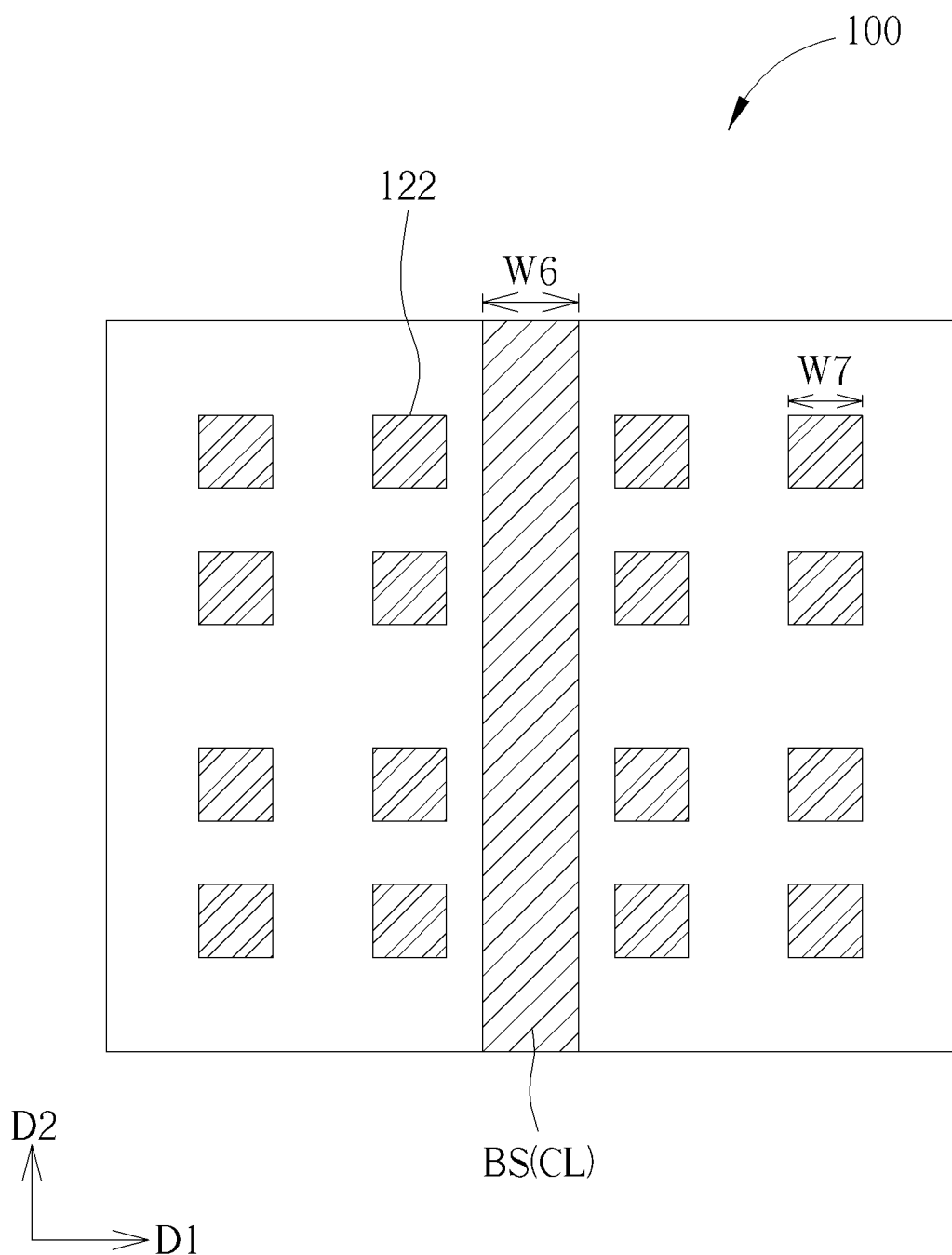
FIG. 16 is a partial-enlargement schematic diagram of a top view of the display region of a display device according to a seventh embodiment of the present disclosure.

Referring to FIG. 16, FIG. 16 is a partial-enlargement schematic diagram of a top view of the display region of a display device according to a seventh embodiment of the present disclosure. This embodiment is different from the fourth embodiment shown in FIG. 12 in that the bending sensor units BS shown in FIG. 16 is a resistance-type sensor and each bending sensor unit BS is composed of only one conductive line CL, but not limited thereto. Each of the conductive lines CL itself is defined as one bending sensor unit BS. In addition, the density of the plurality of bending sensor units BS ($D_B$) is less than the density of the plurality of touch units 122 ($D_T$). The density $D_B$ and density $D_T$ can be calculated based on the previous-mentioned method, and will not be repeated. A ratio of the density of the plurality of bending sensor units BS to the density of the plurality of touch units 122 may be greater than or equal to 0.01 and less than 0.5 (i.e., $0.01 \leq D_B/D_T < 0.5$), but not limited thereto. In some embodiments, a minimum width of one bending sensor (such as resistance-type) can be greater than a minimum width of one touch unit. For example, in FIG. 16, a minimum width W6 of one resistance-type bending sensor BS can be greater than a minimum width W7 of one touch unit 122.

Figure 17:
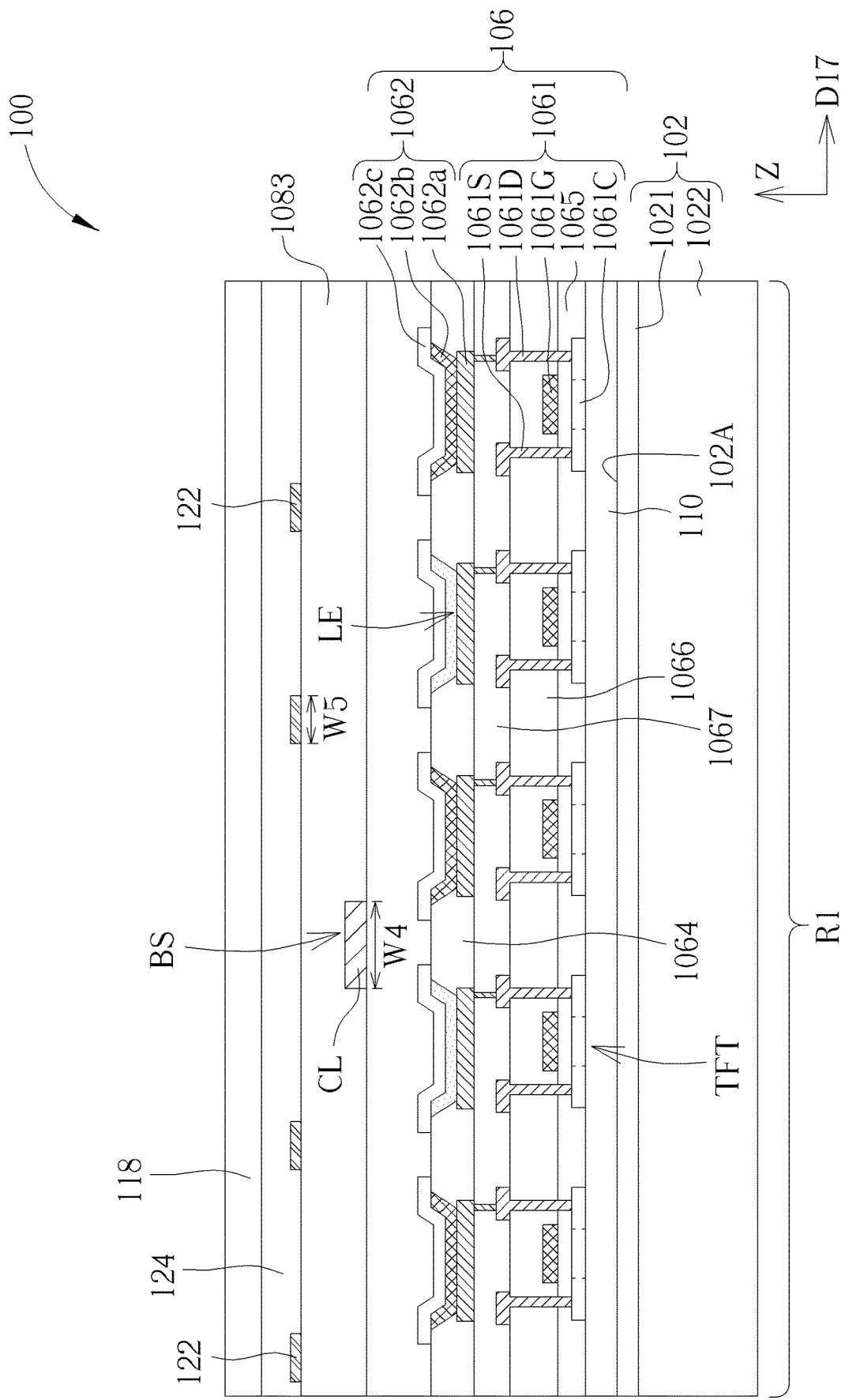
FIG. 17 is a schematic diagram illustrating a cross-sectional view of a display device according to another embodiment of the present disclosure.

FIG. 17 is a schematic diagram of a cross-sectional view of a display device according to another embodiment of the present disclosure. As shown in FIG. 17, the bending sensors BS of this embodiment are resistance-type sensors and are formed with the conductive lines CL. The touch units 122 are disposed on the bending sensor units BS and do not overlap or cover the bending sensor units BS in the direction Z perpendicular to the front surface 102A of the substrate structure 102. The conductive layer for forming the touch units 122 may include transparent conductive material or may be a metal mesh layer, but not limited thereto. The touch units 122 can be in a metal mesh type. Furthermore, the width W4 of the bending sensor unit BS is greater than the width W5 of the touch units 122 along the same direction D17.

According to the present disclosure, bending sensor units are disposed on the display layer to detect the bending state of the display device. In some embodiments, the bending sensor units may not overlap the light emitting units or be spaced apart from the light emitting units in order to not affect the display performance. Moreover, in some embodiments, specific value of ratio of the density of the bending sensor units to the density of the light emitting units are introduced, so as to provide a better performance of the display device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
a flexible substrate;
a display layer disposed on the flexible substrate and including a plurality of light emitting units;
a first conductive layer disposed on the display layer, comprising a plurality of first conductive lines; and
a second conductive layer disposed on the first conductive layer, comprising a plurality of second conductive lines, wherein a portion of the second conductive lines intersects the plurality of first conductive lines to form a plurality of capacitors, and another portion of the second conductive lines forms a plurality of touch units,
wherein one of the plurality of first conductive lines has a first part overlapping one of the plurality of second conductive lines and a second part not overlapping the one of the plurality of second conductive lines, and a first width of the first part along a first direction is greater than a second width of the second part along the first direction,
wherein at least one of the plurality of capacitors does not overlap the plurality of light emitting units in a top view of the display device, and
wherein a distance between two adjacent first conductive lines of the plurality of first conductive lines is greater than a distance between two adjacent second conductive lines of the plurality of second conductive lines.

2. The display device as claimed in claim 1, wherein the at least one of the plurality of capacitors is disposed between two adjacent ones of the plurality of light emitting units in the top view of the display device.

3. The display device as claimed in claim 1, wherein a density of the plurality of capacitors is less than a density of the plurality of light emitting units.

4. The display device as claimed in claim 1, wherein at least one of the plurality of touch units is in a metal mesh type.

5. The display device as claimed in claim 1, wherein at least one of the plurality of touch units does not overlap the plurality of light emitting units in the top view of the display device.

6. The display device as claimed in claim 1, further comprising an insulating layer disposed between the first conductive layer and the second conductive layer in a vertical direction perpendicular to a surface of the flexible substrate.

* * * * *